(12) United States Patent
Malinowski et al.

(10) Patent No.: US 10,096,776 B2
(45) Date of Patent: Oct. 9, 2018

(54) METHOD FOR LITHOGRAPHIC PATTERNING OF ORGANIC LAYERS

(71) Applicant: FUJIFILM Corporation, Tokyo (JP)

(72) Inventors: Pawel Malinowski, Leuven (BE); Atsushi Nakamura, Zwijndrecht (BE); Yu Iwai, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/053,426

(22) Filed: Feb. 25, 2016

(65) Prior Publication Data

US 2016/0172595 A1 Jun. 16, 2016

Related U.S. Application Data

(63) Continuation of application No. PCT/EP2014/067925, filed on Aug. 22, 2014.

(30) Foreign Application Priority Data

Aug. 29, 2013 (EP) .................................... 13182292

(51) Int. Cl.
| | |
|---|---|
| *H01L 21/311* | (2006.01) |
| *H01L 51/00* | (2006.01) |
| *H01L 51/42* | (2006.01) |
| *H01L 51/05* | (2006.01) |
| *H01L 51/56* | (2006.01) |

(52) U.S. Cl.
CPC ...... *H01L 51/0018* (2013.01); *H01L 51/0097* (2013.01); *H01L 51/4253* (2013.01); *H01L 51/0036* (2013.01); *H01L 51/0047* (2013.01); *H01L 51/0508* (2013.01); *H01L 51/42* (2013.01); *H01L 51/56* (2013.01)

(58) Field of Classification Search
CPC ............................ G03F 7/0041; H01L 21/0332
USPC .................................................. 430/316, 317
See application file for complete search history.

(56) References Cited

U.S. PATENT DOCUMENTS

| | | | |
|---|---|---|---|
| 2006/0060855 A1* | 3/2006 | Lee ...................... | H01L 27/1214 257/59 |
| 2006/0099526 A1* | 5/2006 | Yang ...................... | H01L 27/283 430/58.5 |
| 2013/0084531 A1 | 4/2013 | Hamaguchi et al. | |
| 2013/0210176 A1 | 8/2013 | Fushimi et al. | |

FOREIGN PATENT DOCUMENTS

| | | |
|---|---|---|
| JP | 2006-41317 A | 2/2006 |
| JP | 2013-054876 A | 3/2013 |
| JP | 2013-084576 A | 5/2013 |

OTHER PUBLICATIONS

Matthias E. Bahlke, et al. "Dry Lithography of Large-Area, Thin-Film Organic Semiconductors Using Frozen $CO_2$ Resists", Advanced Materials, 2012, pp. 6136-6140, vol. 24.
International Search Report for PCT/EP2014/067925 dated Nov. 20, 2014 [PCT/ISA/210].
International Preliminary Report on Patentability dated Mar. 1, 2016 from the International Bureau in counterpart International Application No. PCT/EP2014/067925.
DeFranco et al., "Photolithographic patterning of organic electronic materials", Organic Electronics 7 (2006) pp. 22-28.
Office Action dated Feb. 28, 2017 from the Japanese Patent Office in counterpart Japanese Application No. 2016-537245.
Office Action dated Oct. 21, 2016, from the State Intellectual Property Office of the P.R.C., in counterpart Chinese Application No. 201480046882.3.
Office Action dated Sep. 12, 2017 from the Korean Intellectual Property Office in counterpart Korean Application No. 10-2016-7004999.
Office Action dated Jun. 5, 2017, from the State Intellectual Property Office of People's Republic of China in counterpart Chinese Application No. 201480046882.3.
Communication dated Mar. 30, 2018 from the Taiwanese Intellectual Property Office in corresponding Taiwanese application No. 103129269.
Office Action dated Feb. 23, 2018, issued by the Korean Intellectual Property Office in corresponding Korean Application No. 10-2016-7004999.

* cited by examiner

*Primary Examiner* — Daborah Chacko-Davis
(74) *Attorney, Agent, or Firm* — Sughrue Mion, PLLC (57) ABSTRACT

A method is provided for photolithographic patterning of an organic layer, comprising: providing a shielding layer on the organic layer; providing a photoresist layer on the shielding layer; illuminating the photoresist layer through a shadow mask; developing the photoresist layer, thereby forming a patterned photoresist layer; performing a first dry etching step using the patterned photoresist layer as a mask, thereby removing at least an upper portion of the photoresist layer and completely removing the shielding layer at locations not covered by the photoresist layer; performing a second dry etching step using the patterned shielding layer as a mask, thereby removing the organic layer at locations not covered by the shielding layer; and removing the shielding layer, wherein removing the shielding layer comprises exposing it to water. A method of the present disclosure may advantageously be used in a process for fabricating organic semiconductor based devices and circuits.

11 Claims, 9 Drawing Sheets

METHOD FOR LITHOGRAPHIC PATTERNING OF ORGANIC LAYERS

CROSS-REFERENCE TO RELATED APPLICATIONS

This application is a Continuation of PCT International Application No. PCT/EP2014/067925 filed on Aug. 22, 2014, which claims priority under 35 U.S.C. § 119(a) to European Patent Application No. 13182292.6 filed on Aug. 29, 2013. Each of the above application(s) is hereby expressly incorporated by reference, in its entirety, into the present application.

FIELD OF THE INVENTION

The present disclosure is related to methods for patterning of organic layers, such as organic semiconductor layers, by means of photolithography.

The present disclosure is further related to methods for fabricating organic electronic devices wherein the organic semiconductor layer is patterned by photolithography.

STATE OF THE ART

Organic electronics research is steadily growing, with developments in materials, processes and system integration. Applications such as organic photovoltaic cells (OPV), organic photodetectors (OPD), organic thin-film transistors (OTFT) and especially organic light-emitting diodes (OLED) for lighting and displays are leading the way to industrialization.

One of the bottlenecks of known methods for the fabrication of organic electronic devices is related to the limitations of currently available patterning techniques.

For example, a patterning technique commonly used in fabrication processes for organic electronic devices is based on shadow masking technology. This technology allows defining features with a size in the order of 30 micrometer or more. It is a disadvantage of this approach that it does not allow very accurate alignment. It is a further disadvantage of shadow masking technology that it requires rather cumbersome hardware maintenance, and that it is not up-scalable to large substrate sizes.

Widely investigated additive techniques such as inkjet printing offer a similar resolution as shadow masking. However, additive techniques are not well suited for complex layer stacks, e.g. multilayer stacks. For example, accurate alignment may be difficult.

Several other patterning processes are emerging, such as for example self-assembly, e.g. based on using a spin-casting process on a pre-patterned substrate. This process requires careful selection of repelling/attracting patterning materials for a specific organic active layer. Another example of an emerging patterning approach is laser-induced forward transfer (LIFT).

The most promising technique to achieve a pattern resolution below 10 micrometer in a reproducible way and on large wafer sizes may be photolithography. However, using a photolithographic process in combination with organic semiconductors is not straightforward, because most of the solvents used within standard photoresists, as well as the solvents used for resist development and/or resist stripping may dissolve the organic layers. A few solutions to this problem have been proposed.

One solution is based on dry lithography using frozen $CO_2$ photoresists, as for example described by Matthias E. Bahlke et al in "Dry lithography of large-area, thin-film organic semiconductors using frozen $CO_2$ resists", Adv. Mater., 2012, 24, 6136-6140. This method offers resolutions in the order of 100 micrometer. It is a disadvantage that it requires very low substrate temperatures, in the range of 20 K to 100 K.

Another solution is based on orthogonal processing, wherein fluorinated photoresists are used. This approach offers micron resolutions with standard photolithography equipment. However, it is very costly to manufacture the fluorinated products, and their disposal is also very expensive and troublesome.

Still another solution uses a boundary layer or a barrier layer to protect the organic semiconductor layer and to avoid direct contact between the organic semiconductor layer and the photolithographic chemicals. Such method is for example described by John A. DeFranco et al in "Photolithographic patterning of organic electronic materials", Organic Electronics 7 (2006) 22-28. A parylene-C layer is provided by chemical vapour deposition (CVD) on top of an organic film to protect it during the deposition and the development of a photoresist. Once developed, the photoresist serves as a mask for a dry etch step that is used to transfer the resist pattern to the parylene layer and to the underlying organic film. The parylene film is then peeled off, thereby also removing the photoresist in a solvent free manner, and leaving a patterned organic film on the substrate. It is a disadvantage of this approach that the parylene-C layer is provided by CVD, which is a rather expensive process that requires a high vacuum. It is a further disadvantage of this approach that removing the parylene-C layer requires mechanical peeling off. Mechanical peeling off may be difficult to control and it may cause defect formation.

SUMMARY

The present disclosure aims to provide methods for photolithographic patterning of organic layers such as organic semiconductor layers, wherein the methods overcome the disadvantages of the prior art.

The present disclosure is related to a method for photolithographic patterning of an organic layer deposited on a substrate, wherein the method comprises: providing a shielding layer on the organic layer; providing a photoresist layer on the shielding layer; illuminating the photoresist layer through a shadow mask; developing the photoresist layer, thereby forming a patterned photoresist layer; performing a first dry etching step using the patterned photoresist layer as a mask, thereby completely removing the shielding layer at locations not covered by the photoresist layer, thus forming a patterned shielding layer; performing a second dry etching step using the patterned shielding layer as a mask, thereby completely removing the organic layer at locations not covered by the shielding layer; and completely removing the shielding layer, wherein removing comprises exposing the shielding layer to water.

In a method of the present disclosure the organic layer is preferably a layer that does not degrade under treatment with water.

In a method of the present disclosure, the organic layer may be an organic semiconductor layer.

Some of the organic materials which can be used in processes according to aspects of the present invention include for instance;

A/ For Organic Light Emitting Devices (OLEDs):
  Hole Injection Layer (HIL): F4-TCNQ, Meo-TPD, HATCN, MoO3;
  Hole Transport Layer (HTL): Meo-TPD, TPD, spiro-TAD, NPD, NPB, TCTA, CBP, TAPC, amine and/or carbazole based material;
  Electron Transport Layer (ETL): Alq3, TPBI, Bphen, NBphen, BCP, BAlq, TAZ . . . ;
  Electron Injection layer (EIL): Lif, CsCO3, CsF, Yb, Liq . . . ;
Host; MCP, TCTA, TATP, CBP, carbazole based materials . . . ;
Red dopant: DCJTB, Rubrene, Ir(btp)2(acac), PtOEP, Ir(MDQ)2acac, . . . ;
Green dopant: C545T, Ir(PPY)3, Ir(PPY)2acac, Ir(3mppy)3 . . . ;
Blue dopant: BCzVBi, DPAVBi, FIrPic, 4P-NPD, DBZa, . . . ;
B/ For Organic Photovoltaic Devices/Organic Photodiodes (OPV/OPD):
  1/ photoactive blends consisting of a donor and an acceptor, where
    Donor is a phthalocyanine, thiophene, acene, diketopyrrolopyrrole, tris-amine, pyridine, porpherine, malononitrile or a derivativion thereof;
    Acceptor is a perylene, fullerene, (sub)phthalocyanine or a derivative;
    Any combination of the above;
    Any polymerized version of the above;
  2/ buffer layers:
    Hole transport layers: benzidine, pyridine, tris-amine, (spirobi)fluorine or derivation thereof;
    Electron transport layers: phenantroline, pyridine;
    Both transport layer can be doped with an organic, metal-oxide or a metal dopant.

In a method of the present disclosure, the shielding layer may comprise or contain a water based polymer material that is not cross linkable. It is an advantage of using a water based material that it allows avoiding damage to or intermixing with the underlying organic layer. It is an advantage of using a material that is not cross linkable that it can be removed easily and completely with water or a water based solution.

In a method of the present disclosure, providing the shielding layer may comprise providing the shielding layer by solution processing, e.g. by spin coating, followed by soft baking at e.g. about 100° C. It is an advantage of such solution based methods that they are cost effective and that they do not require a vacuum. The shielding layer may for example have a thickness in the range between 300 nm and 1000 nm, the present disclosure not being limited thereto.

In a method of the present disclosure, the shielding layer may comprise any of or any combination of Polyvinylpyrrolidone, Polyvinyl alcohol, Pullulan.

In a method of the present disclosure, exposing the shielding layer to water comprises exposing the shielding layer to pure water or to a water comprising solution, comprising more than 80% of water, more preferably comprising more than 90% of water.

In a method of the present disclosure, the water comprising solution further comprises Isopropyl alcohol (IPA) and/or Glycerin.

In a method of the present disclosure, providing the photoresist layer may comprise providing a photoresist layer that is solvent developable. Preferably, the photoresist is a negative tone resist. It is an advantage of using a solvent developable photoresist that it is compatible with the water based shielding layer.

In a method of the present disclosure, performing the first dry etching step may further comprise removing at least an upper portion of the photoresist layer.

In a method of the present disclosure, performing the second dry etching step may further comprise removing a remaining portion of the photoresist layer. Performing the second dry etching step may further comprise removing an upper portion of the shielding layer. Preferably the photoresist layer is completely removed after the second dry etching step.

In a method of the present disclosure, performing the first dry etching step and performing the second dry etching step may comprise performing a reactive ion etching (RIE) step, for example using an oxygen plasma or any other suitable plasma such as for example an Ar plasma, an $SF_6$ plasma or a $CF_4$ plasma, the present disclosure not being limited thereto.

The first dry etching step and the second dry etching step may be separate steps, e.g. using different etch conditions. Alternatively, the second dry etching step may be a continuation of the first dry etching step, and substantially the same etching conditions may be used in both steps.

In a method of the present disclosure, removing the shielding layer may comprise coating a water layer on top of the shielding layer.

A method of the present disclosure may advantageously be used in a process for fabricating organic semiconductor based devices and circuits, such as for example organic photodetectors (OPD), organic thin-film transistors (OTFT) or organic light-emitting diodes (OLED). A method of the present disclosure may for example be used in a fabrication process for OLED displays, allowing obtaining higher resolutions than with the currently used shadow masking technology. For example, a method of the present disclosure may also be used for patterning of micron sized or sub-micron sized pixel arrays of organic CMOS imagers.

It is an advantage of a method of the present disclosure that it allows using photolithographic products (photoresists, developers) already used in the microelectronics industry. It is an advantage that there is no need for using expensive products such as fluorinated photoresists.

It is an advantage of a method of the present disclosure that it is up-scalable and that it is compatible with existing semiconductor process lines.

It is an advantage of a method of the present disclosure that the highest processing temperature used for patterning of the organic layer may be below 150° C., or even below 110° C. Therefore the method may be used on flexible foil substrates such as for example a polyethylene naphthalate (PEN) foil or a polyethylene terephthalate (PET) foil, thus enabling the fabrication of flexible organic devices and circuits with high resolution.

It is an advantage of a method of the present disclosure that it may be cost effective and well controllable.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

Any reference signs in the claims shall not be construed as limiting the scope of the present disclosure.

In the different drawings, the same reference signs refer to the same or analogous elements.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

FIG. 1 schematically illustrates process steps of a method according to the present disclosure. In a first step, illustrated in FIG. 1(a), an organic layer 11, e.g. an organic semiconductor layer, is provided on a substrate 10, for example by a solution based process such as spin coating or by any other suitable method known by a person skilled in the art. The substrate 10 may for example be a glass substrate or any other suitable substrate known to a person skilled in the art, such as for example a flexible foil substrate.

Figure 1A:
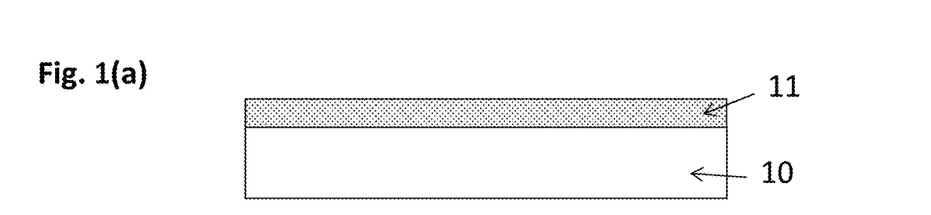
FIG. 1(a) to FIG. 1(g) schematically illustrate process steps of a method in accordance with the present disclosure.
Figure 1B:
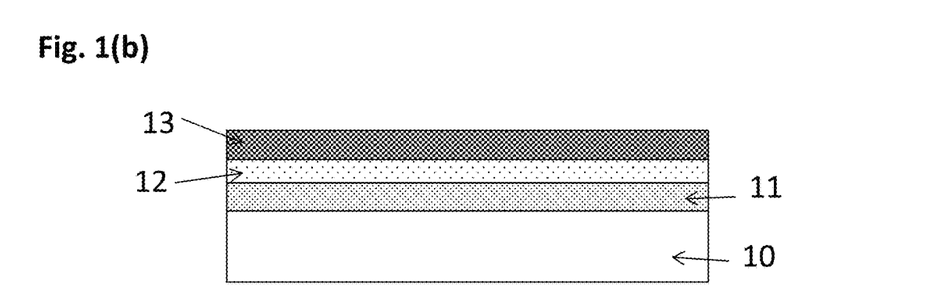

Next, a shielding layer 12 is provided on the organic material layer 11. The shielding layer 12 comprises a shielding material, the shielding material being a water based polymer that is not cross linkable. The shielding material is neutral to the organic layer, i.e. it does not affect the organic layer. The shielding layer can comprise for instance any of Polyvinylpyrrolidone, Polyvinyl alcohol, and Pullulan. The shielding layer 12 may be provided by a solution based process such as for example spin coating. Subsequently a soft bake, e.g. a hot plate soft bake, for example at a temperature in the range between 90° C. and 110° C. may be done. Then a photoresist layer 13 is spin coated on the shielding layer 12, followed by a soft bake step, such as for example a hot plate soft bake step for 1 minute at 100° C. The photoresist layer 13 comprises a photoresist that may be developed in a solvent. The photoresist is preferably a negative tone resist. A cross section of the resulting structure is shown in FIG. 1(b).

Figure 1C:
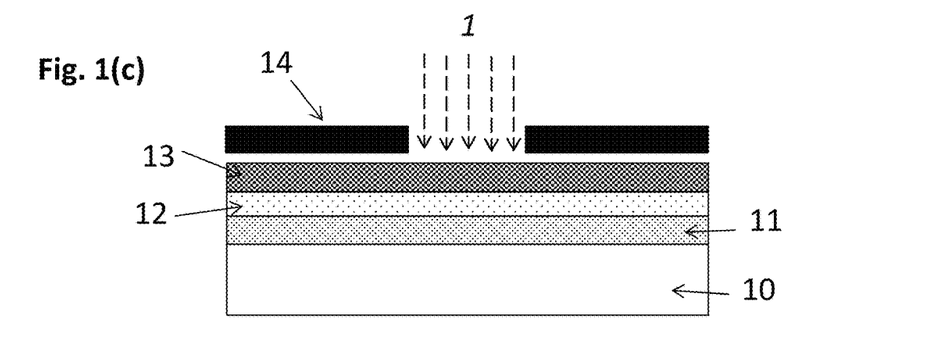
Figure 1D:
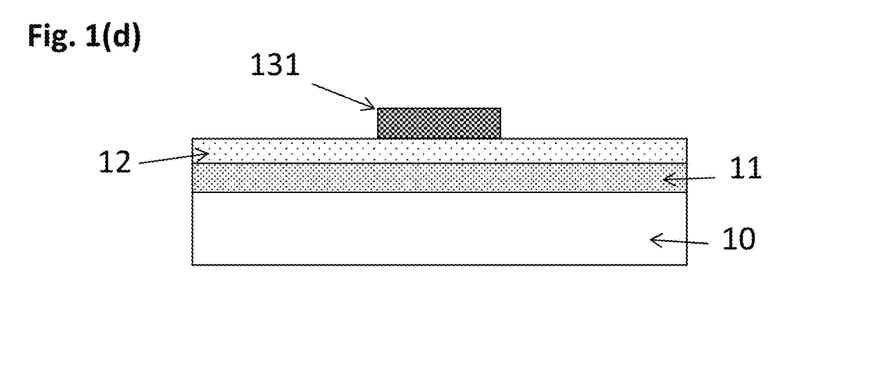

The photoresist layer 13 is then exposed to light 1, e.g. UV light, through a shadow mask 14 as illustrated in FIG. 1(c). After development of the photoresist, the structure shown in FIG. 1(d) is obtained, with a patterned photoresist layer 131.

Figures 1E, 1F:
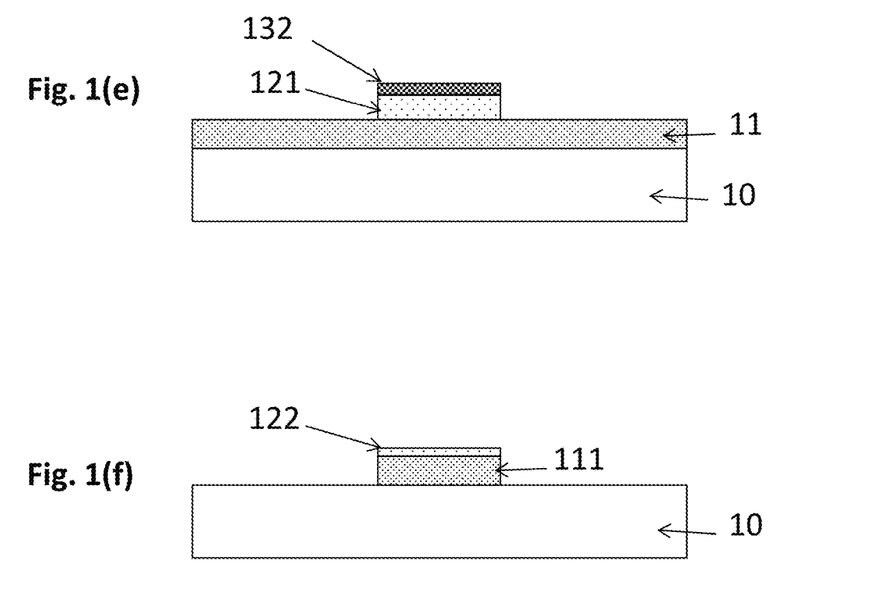
Figure 1G:
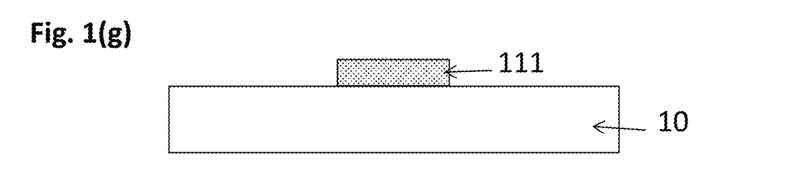

After photoresist development a first dry etching step is done, such as for example a reactive ion etching step using an oxygen plasma, thereby removing (at least) an upper portion of the photoresist layer 131 and completely removing the shielding layer 12 at the locations where it is exposed to the plasma (at the exposed locations, i.e. at locations where no photoresist is present anymore), resulting in a structure as for example shown in FIG. 1(e). The layer thicknesses (and etch rates) of the photoresist layer 13 and the shielding layer 12 are selected such that after this first dry etching step, at least a layer of shielding material remains. The remaining layer of shielding material can for instance have a thickness of at least 200 nm or at least 300 nm, but the invention is not limited thereto. The remaining shielding material layer acquires the pattern of the photoresist. In the example shown in FIG. 1(e), the resulting structure comprises a patterned shielding layer 121 and a thinned photoresist layer 132. However, in other embodiments of the present disclosure the photoresist layer may be fully removed by the first etching step. In other embodiments of the present disclosure, in addition an upper portion of the shielding layer may be removed by the first dry etching step.

After complete removal of the shielding layer 12 at the exposed locations, a second dry etching step is done. In advantageous embodiments of the present disclosure, the second dry etching step may be a continuation of the first dry etching step. The second dry etching step may for example comprise reactive ion etching using an oxygen plasma. The second dry etching step results in a complete removal of the organic layer 11 at the exposed locations (i.e. at the locations where no shielding layer is present any more). Simultaneously, the thinned photoresist layer 132 (if present) is completely removed, as well as an upper portion of the patterned shielding layer 121, resulting in a thinned shielding layer 122. By properly selecting the thickness of the shielding layer in view of the thickness of the organic material layer (and taking into account the corresponding etch rates), after complete removal of the organic layer, there remains still a thin, protective layer of the shielding material 122. This is shown in FIG. 1(f).

Finally the remaining shielding material layer 122 may be removed in water or a water based solution, for instance a solution of water (90%) and IPA (10%) or a mixture of water (90%), IPA (5%) and Glycerin (5%), for example by spin-coating a water layer on the device. This results in a photolithographically patterned organic layer 111 on the substrate 10, illustrated in FIG. 1(g).

Experiments were performed wherein a method of the present disclosure was used for patterning a solution-processed organic film comprising a P3HT:PCBM bulk heterojunction. The interaction between the organic layer and different products used in the photolithographic process, such as the shielding layer material, the photoresist, the resist developer and a resist stripper, was investigated.

The process sequence of FIG. 1 was used, on a glass substrate and with a P3HT:PCBM blend (organic semiconductor layer) provided on the glass substrate by spin coating followed by soft baking.

Figure 2A:
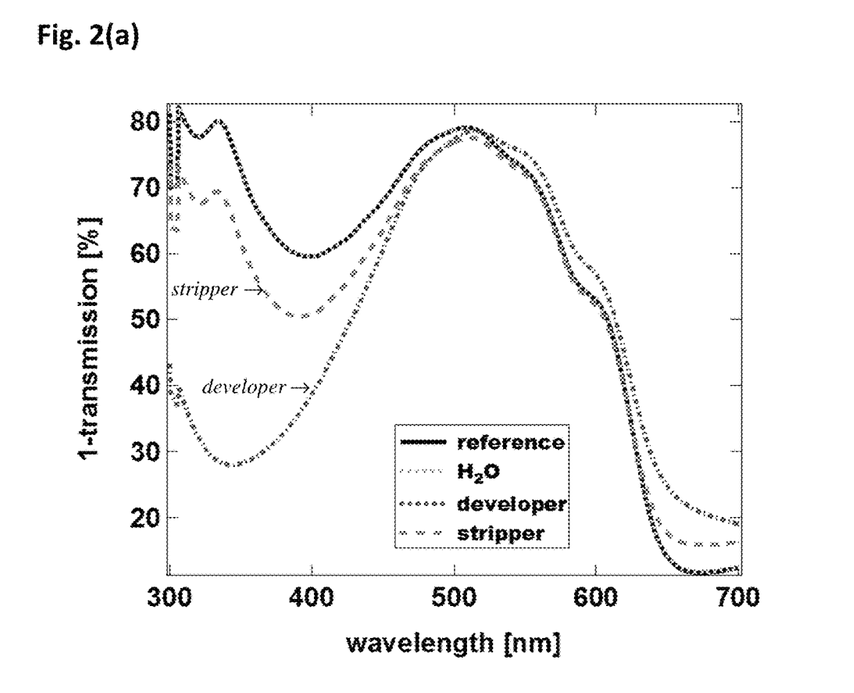
FIG. 2(a) shows the measured absorption as a function of wavelength for a P3HT:PCBM layer after deposition and soft baking (full line), after treatment with water (coincident with full line), after treatment with a resist developer (dotted line) and after treatment with a resist stripper (dashed line).
Figure 2B:
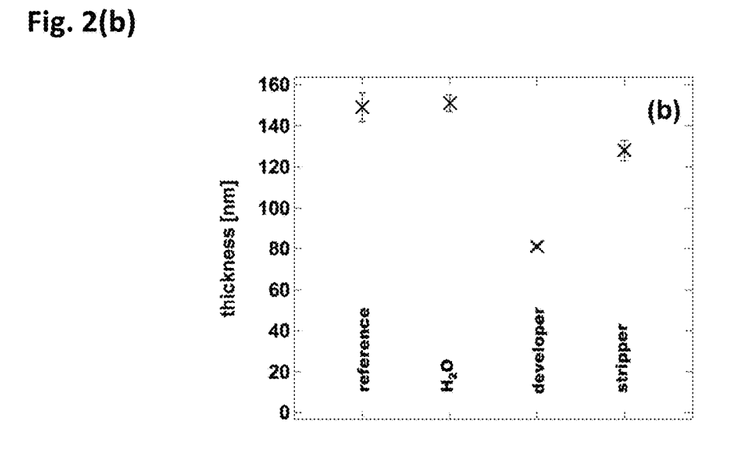
FIG. 2(b) shows the remaining organic layer thickness after the different treatments.

In a separate experiment the organic active layer was treated separately with several products (water, photoresist developer, photoresist stripper) involved in the patterning process, by spin coating these products on top of the organic layer. FIG. 2(a) shows the measured absorption as a function of wavelength for a P2HT:PCBM layer after deposition and soft baking (full line), after treatment with water (coincident with full line), after treatment with a developer (dotted line) and after treatment with a stripper (dashed line). FIG. 2(b) shows the remaining organic layer thickness after the different treatments. These results show that after application of either a developer or a stripper, the absorption spectrum of the P3HT:PCBM blend is affected (FIG. 2a), mostly in the wavelength range related to the PCBM absorption (300 nm to 450 nm). The results of the thickness measurement (FIG. 2b) also show that the organic layer thickness decreases to approximately half of the original value (150 nm) after treatment with the developer. On the other hand, treatment with water (used in a process of the present disclosure to remove the shielding material) does not affect either of the parameters.

Figure 3A:
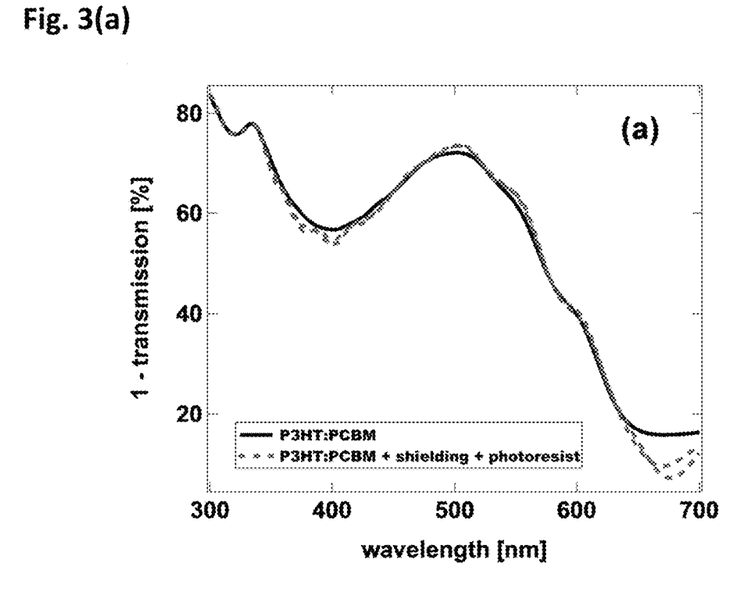
FIG. 3(a) shows the measured absorption as a function of wavelength for a P3HT:PCBM layer after deposition and baking of the P3HT:PCBM layer (full line) and after providing the shielding layer and the photoresist layer on the organic layer in accordance with a method of the present disclosure (dashed line).
Figure 3B:
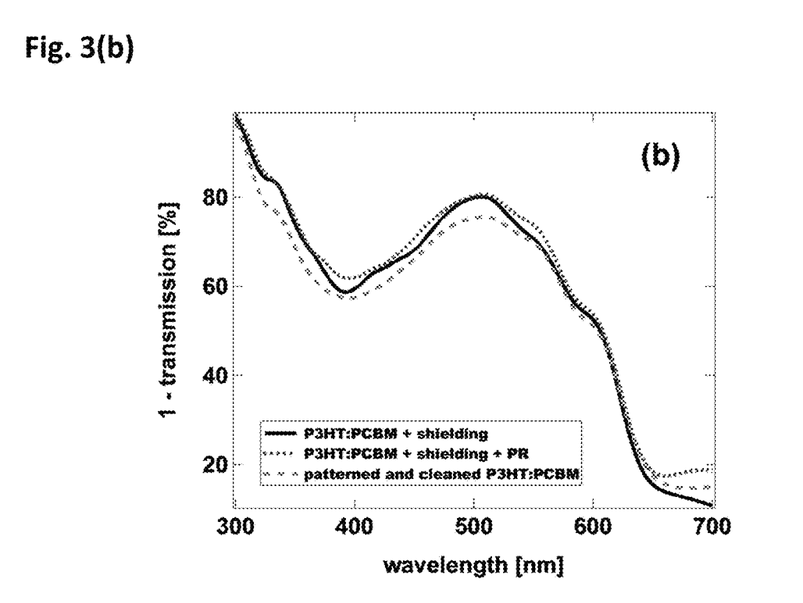
FIG. 3(b) shows the measured absorption spectrum for a P3HT:PCBM organic layer covered with a shielding material layer (full line), for a P3HT:PCBM layer covered with a shielding layer and a photoresist layer (dotted line), and after patterning of the organic layer in accordance with a method of the present disclosure (dashed line).

The absorption spectrum of the P3HT:PCBM layer was also measured after performing the full patterning procedure of the present disclosure as illustrated in FIG. 1, using a shielding layer, FIG. 3(a) shows the measured absorption as a function of wavelength for the P3HT:PCBM layer after deposition and baking of the P3HT:PCBM layer (full line) and after providing the shielding layer and the photoresist layer on the organic layer (dashed line). FIG. 3(b) shows the measured absorption spectrum for a P3HT:PCBM organic layer covered with a shielding material layer (full line), for a P3HT:PCBM layer covered with a shielding layer and a photoresist layer (dotted line), and after patterning of the organic layer. From these results it may be concluded that the absorption spectrum of the organic layer is not significantly affected by the patterning process according to aspects of the present disclosure.

It was experimentally shown that, using a method in accordance with the present disclosure, a pattern comprising openings with a diameter of 1 micrometer and with a spacing of 1 micrometer may be defined in a P3HT:PCBM layer on a glass substrate. However, patterns and openings with sizes smaller than 1 micrometer may be formed using a method of the present disclosure.

Figure 4:
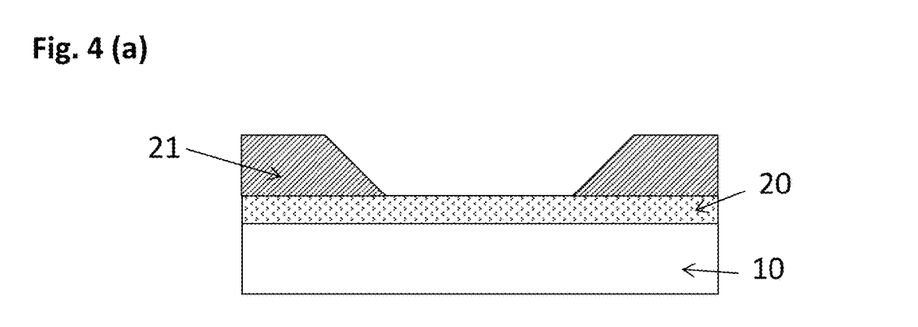
FIG. 4(a) to FIG. 4(h) schematically illustrate process steps of a process for manufacturing organic photodetectors, using an organic layer patterning method in accordance with the present disclosure.
Figure 4B:
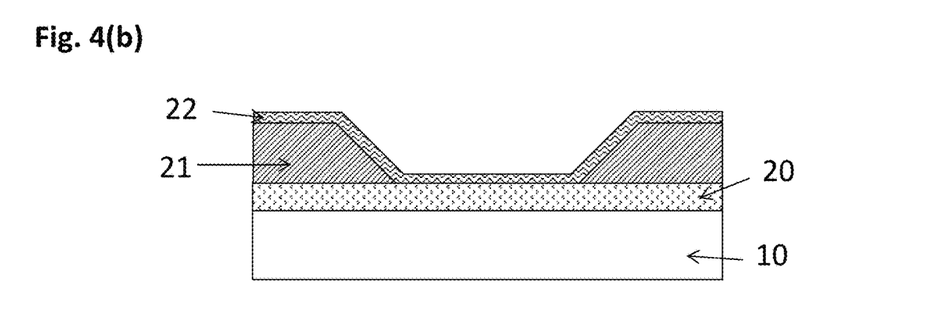
Figure 4C:
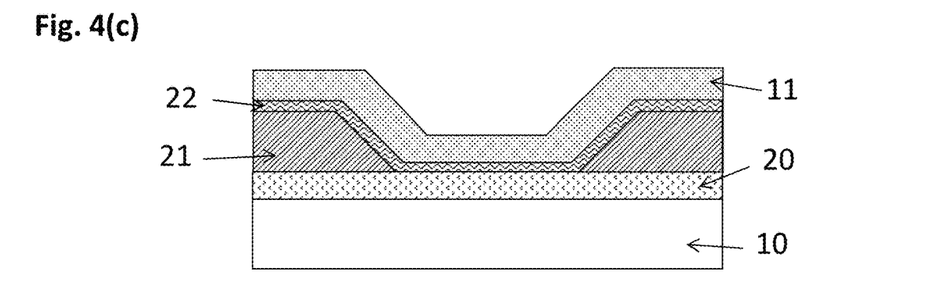
Figure 4D:
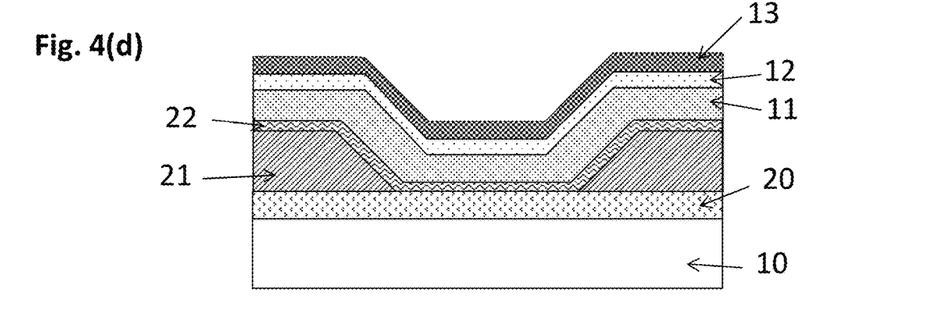
Figure 4E:
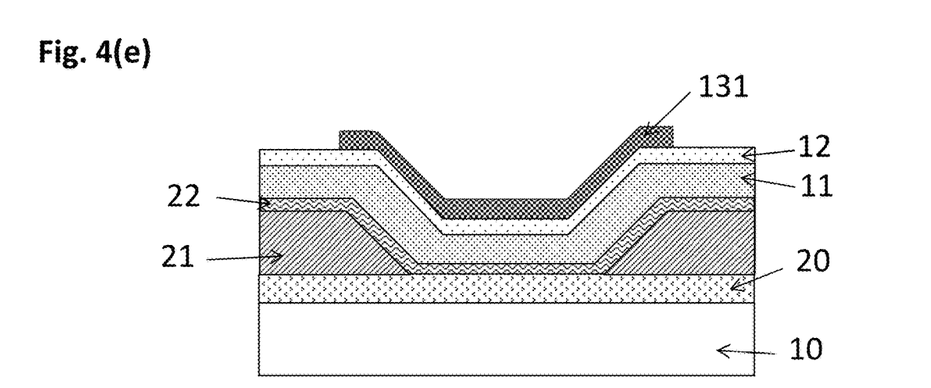
Figure 4F:
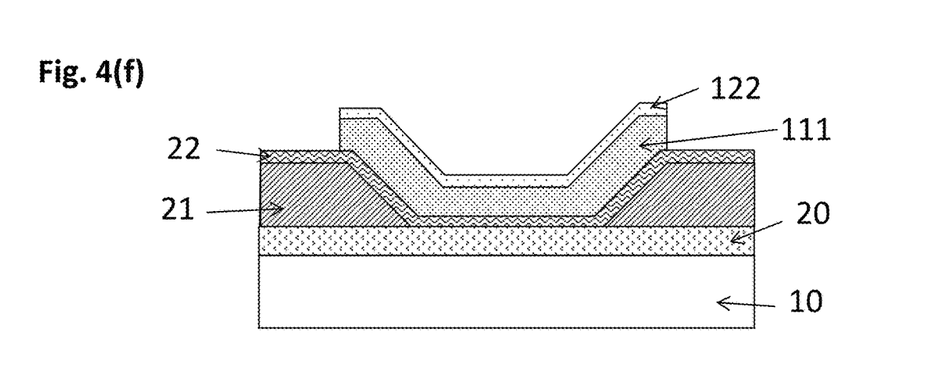
Figure 4G:
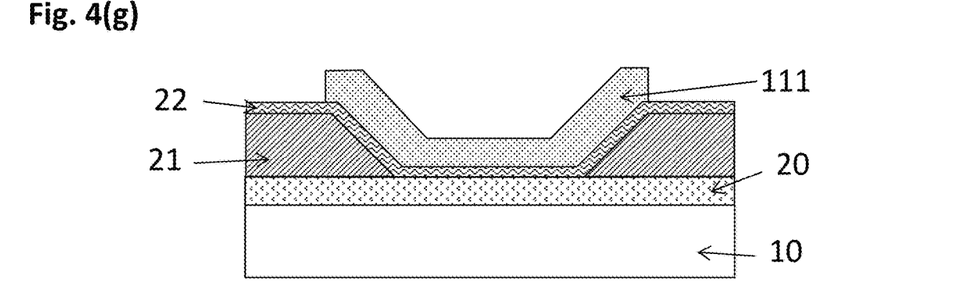
Figure 4H:
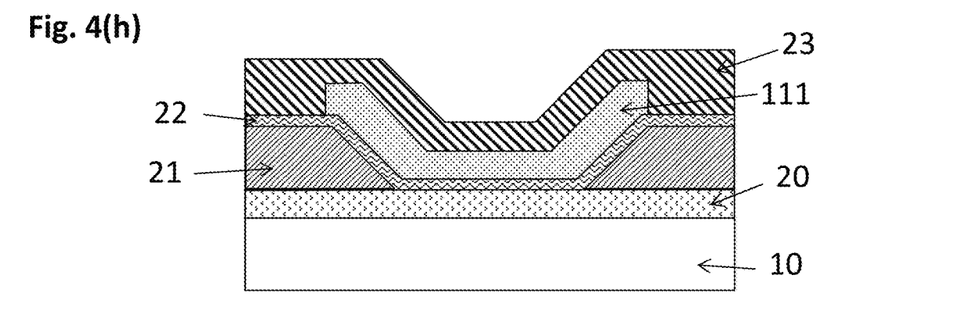

Further experiments were done to investigate the effect of using a patterning process according to the present disclosure for fabricating operational organic electronic devices. Organic photodetector devices with a P3HT:PCBM-based active organic layer were fabricated. The processing sequence, schematically illustrated in FIG. 4, comprises the following steps:

spin coating and photolithographic patterning of a cross-linkable interlayer dielectric 21 on top of a semi-transparent bottom contact (ITO) 20 on a glass substrate 10 (FIG. 4(a)), the interlayer dielectric 21 being the product commercialised by Fujifilm™ as "SK-8000S™" (Non carbon black resist), which is used to create an optical 'black' area, i.e. an area with a very low light transmittance;

thermal evaporation of a metal-oxide hole transport layer (HTL) 22 on top of the interlayer dielectric 21 and the bottom contact 20 (FIG. 4(b));

spin coating and soft baking of a P3HT:PCBM active layer 11 on top of the hole transport layer 22 (FIG. 4(c));

spin coating and soft baking of a shielding material layer 12 on the P3HT:PCBM active layer 11, followed by spin coating and soft baking of a photoresist layer 13 on the shielding material layer 12 (FIG. 4(d));

exposure of the photoresist to UV light through a shadow mask and subsequent development of the photoresist (FIG. 4(e));

reactive ion etching of the photoresist layer, the shielding material layer and the organic active layer using oxygen plasma until the organic active layer is completely removed at the exposed locations (FIG. 4(f));

removal of the remaining shielding material layer by water (could also be water based solution) spin coating (FIG. 4(g)); and thermal evaporation of a Ca/Ag cathode 23 (FIG. 4(h)).

In addition, reference devices were fabricated with a non-patterned organic semiconductor layer, in order to enable a comparison of devices with the same active area. In the reference devices, the interlayer dielectric 21 limits the area of contact of the organic semiconductor layer to the bottom anode 20 and thus defines the active area without the need for patterning the organic semiconductor layer.

Figure 5:
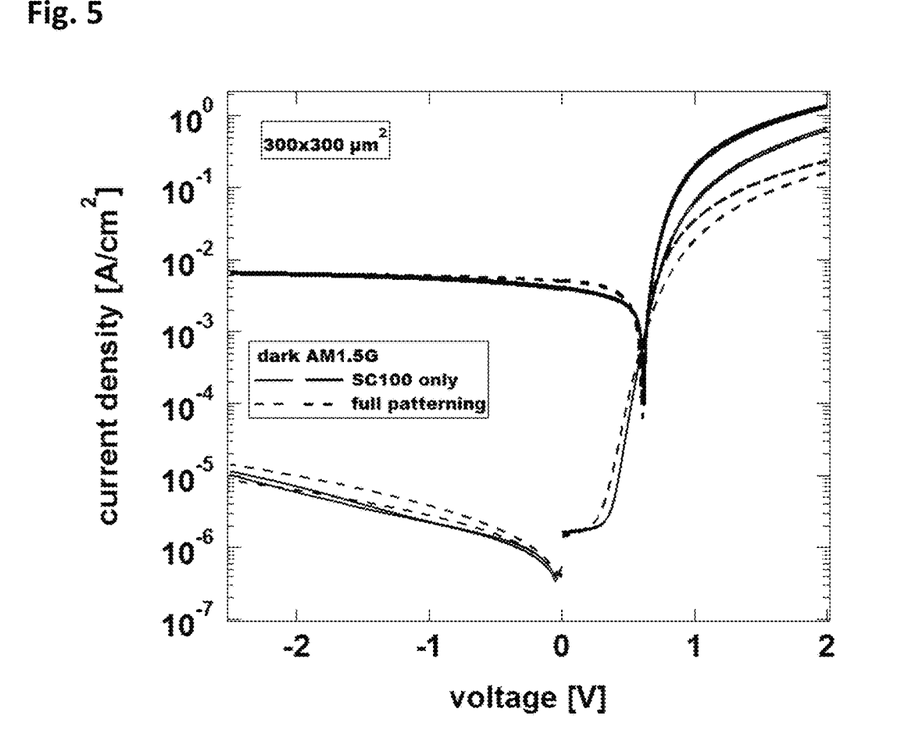
FIG. 5 shows measured current-voltage characteristics of organic photodetectors for reference devices with only an interlayer dielectric (full lines, "SC 100 only") and for devices fabricated using a method of the present disclosure (dashed lines, "full patterning").

FIG. 5 shows measured current-voltage characteristics for reference devices with only an interlayer dielectric and no organic layer patterning ("SC100 only") and for devices fabricated using a method of the present disclosure ("full patterning"). Thin curves show the dark current while the bold curves show the illuminated current under AM1.5 G illumination (1 sun). It was observed that a patterning process of the present disclosure does not introduce significant changes to the current-voltage characteristics, as compared to devices without organic layer patterning. This shows that an organic layer patterning method of the present disclosure is suitable for use in a fabrication process for fully patterned devices based on organic semiconductors.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

What is claimed is:

1. A method for photolithographic patterning of an organic layer deposited on a substrate, the method comprising:
    providing a shielding layer on the organic layer;
    providing a photoresist layer comprising a negative tone photoresist on the shielding layer;
    illuminating the photoresist layer through a shadow mask;
    developing the photoresist layer, thereby forming a patterned photoresist layer;
    performing a first dry etching which uses the patterned photoresist layer as a mask, thereby completely removing the shielding layer at locations not covered by the photoresist layer, thus forming a patterned shielding layer;
    performing a second dry etching which uses the patterned shielding layer as a mask, thereby completely removing the organic semiconductor layer at locations not covered by the shielding layer; and
    completely removing the shielding layer,
    wherein:
    the performing of a first dry etching further comprises removing at least an upper portion of the photoresist layer;
    the performing of a second dry etching further comprises removing a remaining portion of the photoresist layer;
    the performing of a second dry etching further comprises removing an upper portion of the shielding layer;
    the upper portion of the photoresist layer which is not developed and removed in the first dry etching step and the upper portion of the shielding layer in which the region is covered by the photoresist layer are removed in the second dry etching step;
    the photoresist layer is completely removed, resulting in a thinned shielding layer in the second dry etching; and
    the step of completely removing the shielding layer comprises exposing the shielding layer to water, and the shielding layer comprises a water-based polymer material that is not cross-linkable.

2. The method according to claim 1, wherein the organic layer is an organic semiconductor layer.

3. The method according to claim 1, wherein the performing of a first dry etching comprises performing a reactive ion etching which uses an oxygen plasma.

4. The method according to claim 1, wherein the performing of a second dry etching comprises performing a reactive ion etching which uses an oxygen plasma.

5. The method according to claim 1, wherein the shielding layer comprises any of or any combination of polyvinylpyrrolidone, polyvinyl alcohol, and pullulan.

6. The method according to claim 1, wherein the exposing of a shielding layer to water comprises exposing the shielding layer to pure water or to a water-containing solution, comprising more than 80% of water.

7. The method according to claim 6, wherein the water-containing solution further comprises isopropyl alcohol and/or glycerin.

8. The method according to claim 1, wherein the photoresist is a solvent developable photoresist.

9. The method according to claim 1, wherein the substrate is a flexible foil substrate.

10. A method for fabricating an electronic device comprising an organic semiconductor layer, wherein the method comprises patterning the organic semiconductor layer using a method according to claim 1.

11. The method according to claim 1, wherein the thinned shielding layer is removed by spin coating.

* * * * *